United States Patent [19]

Sanders et al.

[11] Patent Number: 5,790,304
[45] Date of Patent: Aug. 4, 1998

[54] SELF-HEALING UV-BARRIER COATING FOR FLEXIBLE POLYMER SUBSTRATE

[75] Inventors: Michael L. Sanders, Windsor; Scott F. Rowlands; Paul G. Coombs, both of Santa Rosa, all of Calif.

[73] Assignee: Optical Coating Laboratory, Inc., Santa Rosa, Calif.

[21] Appl. No.: 816,955

[22] Filed: Feb. 24, 1997

Related U.S. Application Data

[63] Continuation of Ser. No. 60,574, May 10, 1993, abandoned.

[51] Int. Cl.⁶ .................... F21V 9/04; G02B 1/10
[52] U.S. Cl. ............... 359/361; 359/359; 359/582; 427/162; 428/689; 428/701
[58] Field of Search ............... 428/689, 701, 428/912, 933, 543, 420; 359/350, 359, 361, 582; 427/255.7, 419.3, 162

[56] References Cited

U.S. PATENT DOCUMENTS

| | | | |
|---|---|---|---|
| 3,442,686 | 5/1969 | Jones | 117/70 |
| 3,984,581 | 10/1976 | Dobler et al. | 427/35 |
| 4,130,672 | 12/1978 | Onoki et al. | 427/255.7 |
| 4,284,685 | 8/1981 | Olson et al. | 427/162 |
| 4,320,936 | 3/1982 | Sawamura | 359/359 |
| 4,479,862 | 10/1984 | Swenson | 204/192 R |
| 4,519,154 | 5/1985 | Molari, Jr. | 359/359 |
| 4,560,577 | 12/1985 | Mirtich et al. | 427/38 |
| 4,591,514 | 5/1986 | Holzl | 427/255.7 |
| 4,604,181 | 8/1986 | Mirtich et al. | 204/298 |
| 4,661,381 | 4/1987 | Callies et al. | 427/255.7 |
| 4,664,980 | 5/1987 | Sovey et al. | 428/421 |
| 4,686,127 | 8/1987 | Burns | 428/40 |
| 4,746,693 | 5/1988 | Meder | 524/306 |
| 4,842,941 | 6/1989 | Devins et al. | 427/162 |
| 4,849,296 | 7/1989 | Haluska et al. | 428/457 |
| 4,874,643 | 10/1989 | Oldham et al. | 427/340 |
| 4,923,741 | 5/1990 | Kosmo et al. | 428/252 |
| 4,979,802 | 12/1990 | Ichikawa | 359/584 |
| 4,980,206 | 12/1990 | Torre et al. | 427/385.5 |
| 5,102,967 | 4/1992 | Meder | 528/10 |
| 5,122,906 | 6/1992 | Wheatley | 359/586 |
| 5,156,882 | 10/1992 | Rzad et al. | 427/419.3 |
| 5,208,095 | 5/1993 | Nietering | 428/701 |
| 5,234,761 | 8/1993 | Barnes et al. | 428/336 |
| 5,279,853 | 1/1994 | Occhiello et al. | 427/162 |
| 5,294,464 | 3/1994 | Geisler et al. | 427/255.7 |
| 5,310,603 | 5/1994 | Fukuda et al. | 428/701 |
| 5,312,685 | 5/1994 | Banks et al. | 428/701 |
| 5,314,741 | 5/1994 | Roberts et al. | 428/215 |
| 5,376,458 | 12/1994 | Natesan | 428/472 |
| 5,424,131 | 6/1995 | Wertheimer et al. | 428/413 |

FOREIGN PATENT DOCUMENTS

| | | | |
|---|---|---|---|
| 2683230 | 5/1993 | France | C23C 14/34 |
| 0060301 | 4/1982 | Japan | 427/162 |
| 2130501 | 5/1990 | Japan | 427/162 |
| 5345383 | 3/1994 | Japan | B32B 9/00 |

OTHER PUBLICATIONS

Morel, D.E., et al. "Solar Concentrator Materials Development", *Abstract, American Chemical Society*, 3:2032–2038 (1986) [21st Intersociety Energy Conversion Engineering Conference: Advancing Toward Technology Breakout in Energy Conversion, San Diego, CA, USA 25–29 Aug. 1986, ISBN 0–8412–0986–3, 1986 Washington, D.C., USA].

Dever, Bruckner and Rodriguez, Synergistic Effects of Ultraviolet Radiation, Thermal Cycling and Atomic Oxygen on Altered and Coated Kapton Surfaces, AIAA, Reno, Navada, Jan. 6–9, 1992, pp. 1–9.

(List continued on next page.)

*Primary Examiner*—Jon W. Henry
*Assistant Examiner*—John Juba, Jr.
*Attorney, Agent, or Firm*—Workman, Nydegger & Seeley

[57] ABSTRACT

A protective composite thin film coating structure is disclosed which provides ultraviolet (UV)-protection to polymer components used in low earth orbit (LEO) environments. The structure protects such components from physical and optical degradation due to exposure to ultraviolet radiation and oxygen, in particular atomic oxygen.

6 Claims, 2 Drawing Sheets

OTHER PUBLICATIONS

NASA Technical Memorandum 100459; Atomic Oxygen Effects, Measurements for Shuttle Missions, STS–8 and 41–G, vol. 1, Sep., 1988: excerpt (1), pp. 2–1 and 2–9.

NASA Technical Memorandum 100459; Atomic Oxygen Effects, Measurements for Shuttle Missions, STS–8 and 41–G, vol. 1, Sep., 1988: excerpt (2), pp. 7–7.

NASA Technical Memorandum 100459; Atomic Oxygen Effects, Measurements for Shuttle Missions, STS–8 and 41–G, vol. 1, Sep., 1988: excerpt (3), pp. 10–4—10–10.

SELF-HEALING UV-BARRIER COATING FOR FLEXIBLE POLYMER SUBSTRATE

This is a continuation of application Ser. No. 08/060,574, filed May 10, 1993 abandoned.

1. BACKGROUND OF THE INVENTION

The present invention relates to ultraviolet (UV)-protected polymer components useful in low earth orbit (LEO) environments and to coatings for protecting such components from physical and optical degradation due to exposure to ultraviolet radiation oxygen, in particular atomic oxygen.

2. DESCRIPTION OF THE RELEVANT TECHNOLOGY

Flexible polymer film components are useful, for example, in photovoltaic arrays which are used in satellites and other spacecraft. However, in the LEO environment, these polymer components are subject to physical and optical degradation by exposure to atomic oxygen and to ultraviolet radiation.

The current art for protecting such polymer components (also called substrates here) is to apply a silicon oxide monolayer barrier coating to the front and back surfaces of the substrate by wet chemical deposition or physical vapor deposition (PVD) in a vacuum. However, silicon oxide barrier layers, especially those formed on flexible substrates, are subject to cracks and brittle fracture damage due to intrinsic coating stress and/or assembly and handling. Furthermore, the protective barrier coating may be scratched or otherwise abraded. Unavoidably, there are particle inclusions which can become fracture points. Also, coated polymers exhibit pinhole defects caused by the polymer surface topology prior to thin film coating. Defects such as cracks, fractures, scratches, particle inclusions and pin holes have been demonstrated to be the starting points of catastrophic mechanical failure due to exposed polymer etching and barrier undercutting by atomic oxygen of the polymer film substrate during long term LEO space exposure.

FIGS. 1-3 depict schematically the harmful effects of such defects on a polymer substrate 10 having a single layer, silicon oxide barrier coating 11. FIG. 1 illustrates a particle inclusion 12, a void 13 and a through crack 14 in the barrier coating 11. The particle inclusion results in a so-called particle break-out indicated at 16. FIG. 2. Referring also to FIG. 3, the particle break-out, void and crack allow oxygen in the ambient to penetrate to and etch the underlying polymer substrate 10, resulting in the void undercutting shown at 17 (that is, erosion by oxygen of the polymer substrate 10 beneath the void); crack undercutting, indicated at 18; and undercutting via the particle break-out, depicted at 19. As is illustrated in FIG. 3, with continued exposure to the oxygen-containing ambient, the continued erosion can cause significant enlargement of the voids 17, 18 and 19 in the polymer substrate and the loss of structural integrity.

It is expected that similar attack will occur on other unprotected polymer materials, such as carbon graphite composites and inorganic materials such as silicon or metals, especially where the components are subject to flexure or abrasion during assembly and/or use. In addition, it is our understanding that forming the barrier coating by PVD (which is preferable to wet chemical deposition because of superior film density) typically requires high temperatures, within the approximate range 150° C. to 350° C. Such elevated temperatures can degrade thermally sensitive polymer substrates.

3. SUMMARY OF THE INVENTION

In one aspect, our invention is embodied in a composite ultraviolet shield or barrier structure that automatically heals or repairs chemically- and mechanically-caused defects in the structure, including voids, scratches, cracks and inclusions. The barrier structure can be used by itself or applied to a substrate of material such as ultraviolet-sensitive polymer. The self-healing or self-repair of such defects preserves the protection provided by the barrier structure against oxygen attack and optical degradation and resulting catastrophic mechanical failure of both the protected and protective structures. In particular, the self-healing, defect tolerant barrier composite provides durable resistance to degradation by oxygen and optical radiation.

According to another aspect of our invention, the barrier structure comprises a barrier coating and a silicon-containing sacrificial or convertible (base) coating. The barrier coating, preferably an inorganic material and most preferably metal oxide, blocks ultraviolet radiation and oxygen. Specifically, the barrier coating prevents both physical erosion and destruction by oxygen (including atomic oxygen) and degradation including embrittlement and darkening of the polymer-containing substrate due to exposure to ultraviolet radiation.

Please note, as used here, "sacrificial" or "convertible" material is that which is an abundant source of the appropriate chemical or material in the protection process described herein and typically is only partially consumed during the protection process.

The sacrificial silicon-containing base coating, preferably of organo-silicone material, provides silicon and reacts with oxygen to form a silicon-containing, oxygen-containing compound ($SiO_x$) that condenses on defects, encapsulating impurities and filling and covering the voids, cracks, etc., thereby maintaining the integrity of the barrier coating.

The barrier coating and the sacrificial base coating have a symbiotic relationship in that each protects the physical and optical integrity of the other and together they preserve the function of the barrier structure in protecting the polymer-containing substrate from ultraviolet and oxygen attack. Without the sacrificial base coating, defects such as voids or cracks in the metal oxide barrier coating (for example, due to stress in the coating or due to movement or flexing of the substrate) can serve as propagation channels for oxygen erosion, undermining the barrier coating and causing it to detach locally, leaving open wounds which can continue to enlarge and thus to degrade the effectiveness of the barrier coating. In turn, in maintaining the integrity of the barrier coating, the self-healing action of the composite prevents degradation of the sacrificial organo-silicone base coating by ultraviolet radiation and atomic oxygen. Without an effective barrier coating, gross degradation of the organo-silicone coating occurs which is characterized by the formation of dark brown, optically absorbing regions and eventually by the unchecked loss of physical integrity of the organo-silicone coating.

In another aspect, the barrier coating may be selected from a single coating such as silicon oxide, or from plural coatings, which control coating stress and/or are optical components. For example, barrier coatings comprising alternating layers of silicon oxide and titanium oxide can be used as a partial absorber or a reflection element. Also, the barrier coating may comprise alternating layers of compressive and tensile stress materials such as silica ($SiO_2$) and alumina ($Al_2O_3$) to control stress in the barrier coating. The design of such a barrier coating may be selected so that the coating functions as an optical component such as a low emissivity layer and/or a reflection layer. A primer coating can be formed on the substrate to enhance adhesion of the base coating to the substrate.

Our self-healing barrier composite coating imparts excellent durability. Protected polymer components, including flexible components, can be used in oxygen-containing and UV radiation-containing environments and in applications which involve flexing and bending, without degradation by the oxygen or the UV radiation.

4. BRIEF DESCRIPTION OF THE DRAWING

The above and other aspects of my invention are described below with respect to the drawing, in which.

Figure 1:
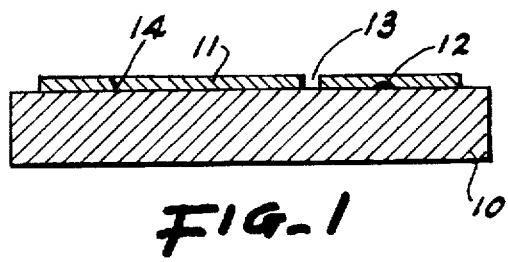
FIGS. 1–3 are schematic depictions of a prior art oxide-coating protected polymer substrate which illustrate the sequential loss of structural integrity in the polymer substrate due to oxygen etching via defects in the metal oxide barrier coating such as cracks, voids and particle inclusions.
Figure 2:
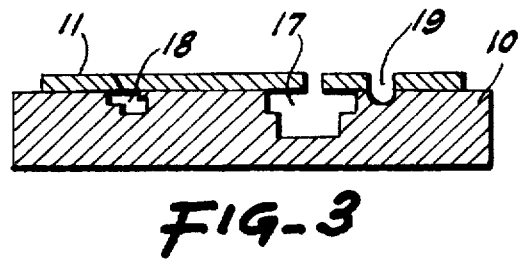
Figure 3:
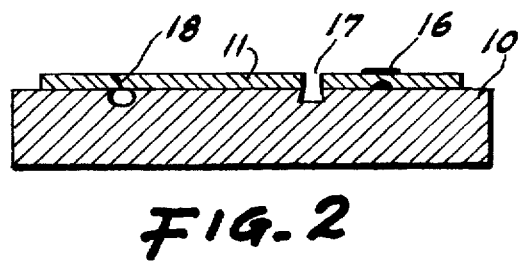

5. DETAILED DESCRIPTION OF THE PREFERRED EMBODIMENT a) Overview of Self-Healing Barrier Coating Construction Referring to FIG. 8, our invention is embodied in a self-healing composite 25 comprising a self-healing coating composite 21 formed over a substrate 22 comprising one or more components such as polymer-containing components. The self-healing composite 21 protects the substrate component(s) and the composite itself from oxygen and ultraviolet environments. Preferably the coating composite 21 comprises a barrier coating 24 and a sacrificial, silicon-containing base coating 23 which is formed on the substrate 22 between the barrier coating and the substrate. The barrier coating, preferably comprising metal oxide, insulates the substrate from chemical attack by oxygen (including atomic oxygen) and from optical degradation by ultraviolet radiation. The sacrificial base coating 23, preferably of organo-silicone material, automatically repairs damage to the barrier coating 24, thereby maintaining intact the barrier coating and preserving the prophylactic functioning of the barrier coating and of the base coating itself. As discussed previously, without the sacrificial base coating 23, breaches in the physical integrity of the barrier coating, such as cracks, voids and pinholes allow oxygen to etch the polymer-containing substrate 22 and permit ultraviolet darkening.

Figure 4:
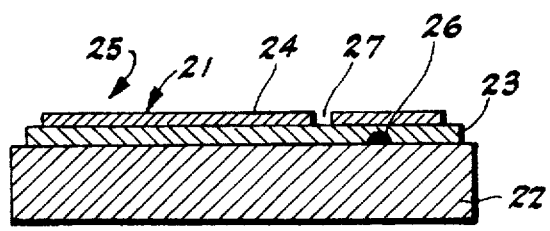
FIGS. 4–7 are schematicized cross-section representations of a preferred embodiment of our self-healing or self-repairing barrier structure depicted in FIG. 8, illustrating the automatic healing action which uses the problem—the oxygen ambient—to form stable oxide skins and plugs which preserve the integrity of the metal oxide barrier coating.
Figure 5:
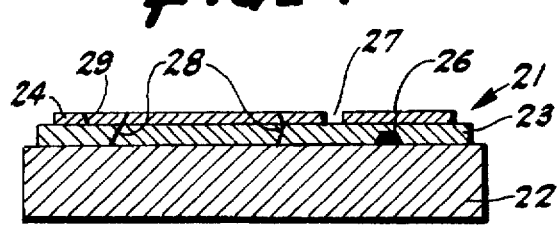
Figure 6:
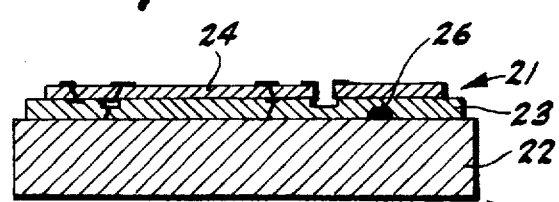
Figure 7:
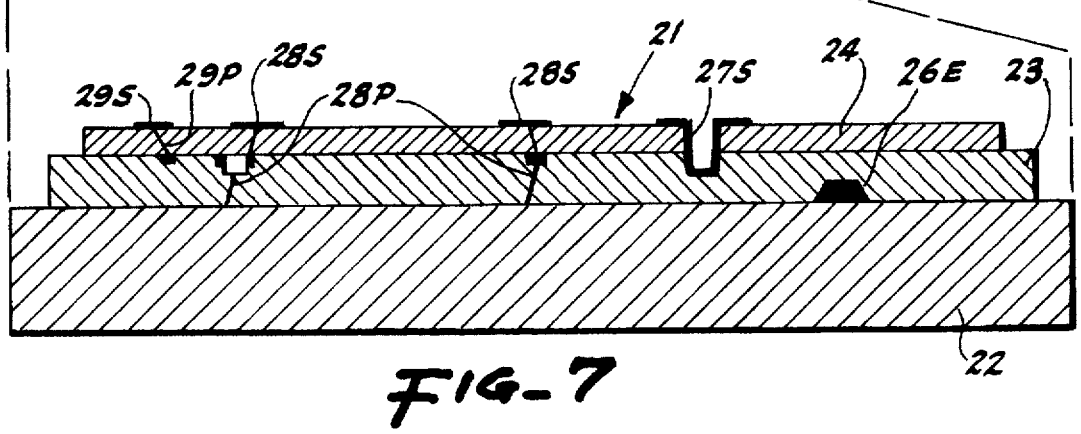

FIGS. 4 and 5 specifically illustrate the presence of typical defects: particle inclusion 26 in the sacrificial base coating 23, void 27 in barrier coating 24, through crack 28 through the barrier coating 24 and the sacrificial base coating 23, and partial crack 29, in the barrier coating. Decomposition of the sacrificial organo-silicon coating 23, which reacts with oxygen in the atmosphere or the ambient that penetrates cracks 28, 29, voids 27, pin holes, scratches, etc., forms a silicon-containing, oxygen-containing compound ($SiO_x$), which fills or plugs and forms layers or skins over the holes, cracks and other breaches in the barrier coating 24 as well as the base coating 23 itself, and encapsulates particles 26 and contaminants. For example, and referring to FIG. 6 and to the enlarged view of FIG. 7, the decomposition reaction forms an encapsulation 26E over the particle inclusion 26 which isolates the inclusion and prevents particle breakout. The decomposition reaction also forms plugs 28P at the interface between the barrier coating 24 and the sacrificial base coating 23, and forms thin layers or skins 28S along the sides of the cracks and at the entrances of the cracks in the barrier coating, thereby terminating expansion of the cracks and isolating them from the barrier coating and the sacrificial coating. Similarly, plugs 29P and skins 29S form over the partial cracks 29, terminating expansion of the cracks and isolating them. Skin 27S forms over the top, side and bottom walls of the voids, thereby preventing enlargement of and isolating the voids.

The metal oxide layer and the silicon-containing oxide plugs, skins, etc. which form automatically when the metal oxide layer is breached are chemically stable and not subject to attack by oxygen. As a consequence, the self-healed structure prevents gas and radiation attack of the composite 20 and thus prevents physical and optical deterioration of the barrier coating 24, the sacrificial base coating 23 and the substrate 22.

b) Barrier Coating Fabrication Process

Our barrier coating 24 preferably is formed using a low temperature physical vapor deposition process, most preferably the MetaMode sputter deposition process of the assignee, Optical Coating Laboratory, Inc., of Santa Rosa, Calif. This process is described in commonly assigned U.S. Pat. No. 4,851,095, issued Jul. 25, 1989 to the inventors Scobey, Seddon, Seeser, Austin, LeFebvre and Manley. The '095 patent is incorporated by reference.

Figure 9:
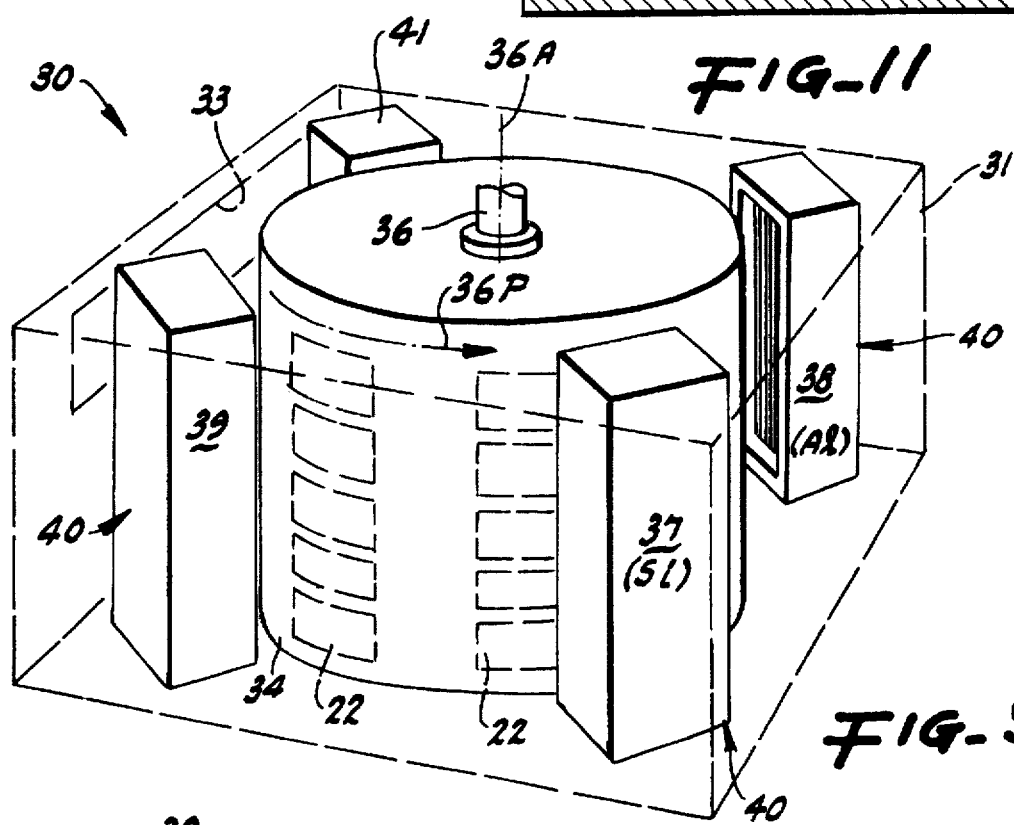
FIGS. 9 and 10 are, respectively, a simplified schematic perspective view and a corresponding top plan view of a preferred physical vapor deposition system used to form the barrier coating of our invention.
Figure 10:
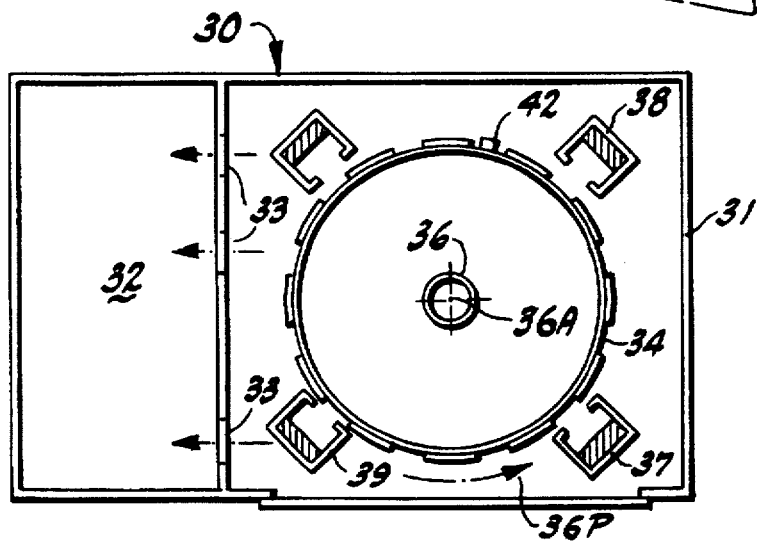

FIGS. 9 and 10 depict a MetaMode vacuum processing chamber system 30 available from the assignee which is preferred for forming the barrier coating according to our invention. As is disclosed in the referenced, incorporated '095 patent, the illustrated system 30 comprises an enclosure 31 which forms a vacuum processing chamber (both the enclosure and the vacuum processing chamber are designated 31 here). The enclosure rotatably mounts a drum 34 therein which is rotated by drive shaft 36 along path 36P for transporting base, layer-coated substrates 22 mounted on the external periphery of the drum past circumferential work stations 40. Specifically, the substrates are transported through processing zones associated with the work stations 40. These include circumferential deposition zones provided by one or more devices 37 and 38 (for example, linear magnetron sputter devices of the type described in the incorporated '095 patent) for depositing materials such as silicon and aluminum, and circumferential reaction zone(s) provided by reaction devices 39 and 41 such as oxidizing devices and/or nitride-forming reaction devices. The reaction devices 39 and 41 may be the inverse linear magnetron ion source devices of the type described in the incorporated '095 patent. Alternatively, the reaction devices 39 and 41 can use linear magnetron cathode devices similar to those used at deposition stations 37 and 38, by substituting oxygen or nitrogen for the argon; or can use other ion sources capable of generating a high energy reactive ionized plasma, such as ion guns, or other devices which generate a high energy reactive ionized DC or RF plasma. The system 30 also includes hardware such as a suitable vacuum pumping system 32 which communicates into the chamber 31 via port 33 for exhausting and pumping down the chamber.

Several alternatives to the single rotary motion approach shown in FIGS. 9 and 10 are disclosed in the incorporated '095 patent. For example, the substrates 22 can be mounted on the drum or cage 34 facing inwardly toward work stations spaced along the internal periphery of the drum. Also, a double rotation, planetary-type substrate mounting system can be used.

Referring further to FIGS. 9 and 10, the deposition devices 37 and 38 are used to deposit material such as silicon and aluminum, whereas reaction devices 39 and 41 are used to chemically react oxygen or nitrogen with the deposited materials to convert the deposited metals to oxides and nitrides. Thus, by rotating the drum 34 and selectively operating one or more of the sputtering devices and one or more of the reaction devices, layers of the metals, oxides and nitrides of the metals, and mixtures and alloys of the metals and oxides and nitrides of the metals can be selectively formed on the substrate alone or in combination. For example, but not by way of limitation, layers of silicon, silicon oxide, and silicon nitride can be formed in essentially any sequence.

c) Overall Coating Process and Structure

Ultraviolet-protected composites can be formed on ultraviolet sensitive substrates such as polymers as follows. (Please note, "composite" refers to the protective coating composite comprising the base coating and the barrier coating and also refers to the combination of the protective coating composite and the protected substrate.) A thin conformal planarizing base layer of space qualified organo-silicone polymer compound is formed on the surface of the substrate to be protected. A number of deposition techniques can be used, even for low melting point polymer materials. These include wet chemical deposition processes such as spray coating, dip coating, flow coating, roll coating and silk screening.

Typically, the sacrificial base coating is then cured, for example by an additive cross-linking agent, low temperature, or ultraviolet activation. Preferably, the thickness of the sacrificial base coating is greater than about 0.001 inch. Thicknesses less than about 0.001 inch may not allow full defect cover and provide enough silicon for healing. Also, thicknesses greater than about 0.010 inch may provide no additional protection relative to thicknesses of about 0.010 inch or less.

The barrier coating is then formed on the base-coated substrate, preferably using the low temperature MetaMode apparatus and process described here and at length in the above-discussed, referenced '095 patent. The thickness of the barrier coat preferably is at least about 500 Å, because thicknesses less than about 500 Å may not be sufficient to block oxygen. The intended thickness of this barrier coat is of course dependent upon its function. For example, for a metal oxide barrier coating of material such as silicon oxide, silicon nitride or silicon oxynitride which is formed using the MetaMode process and is used primarily to shield the composite from oxygen, the thickness of the coating can be within the range of about 500 Å to about 10,000 Å. For a multilayer stress-controlled optical filter barrier coating of alternating layers of titanium oxide, silicon oxide and aluminum oxide, $TiO_x$, $SiO_x$ and $Al_2O_x$, formed using the MetaMode process, the overall coating thickness typically is within the range of about 500 Å to about 10,000 Å. Those of usual skill in the art will readily select materials and material thicknesses which provide the desired enhanced optical functions, such as emittance or reflectance, for given applications.

The adhesion of the base (sacrificial) coating to the substrate can be enhanced by a thin primer coating or subcoating on the substrate, between the substrate and the base coating, as is typically done by one skilled in the art.

The invention is applicable to any substrate or material on which the barrier coating composite can be formed, and is usefully applied to any such oxygen-sensitive substrate for which shielding from physical, chemical or optical degradation is desired in an oxygen-containing ambient, so long as the following characteristics are present: the barrier coating comprises a stable oxide; and the base or sacrificial coating decomposes when exposed to oxygen, leaving stable oxide residues within the defect, and preferably is conformal. Examples of materials include polymers generally; polyimides; polyimide composites including those which use polyimide resin binders; carbon and carbon-containing materials; and carbon matrix composites. Other examples of materials include metals and metal alloys and compounds which form a non-protective oxide skin and/or for which enhancement or stabilization of the surface optical properties is important. Metals having a high strength-to-weight ratio or unique electrical properties, which make them advantageous for space applications, include silver, titanium, lithium and magnesium. Specific components include photovoltaic cells, cast silicone polymer solar concentrator optical elements, polyimide covers, and mechanical backplane structures for photovoltaic arrays.

Figure 11:
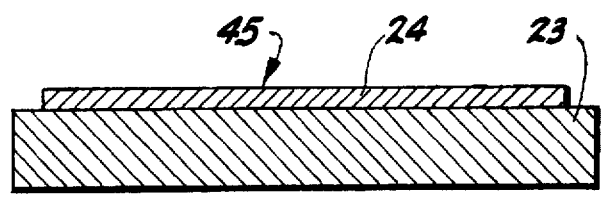

Furthermore, the invention may be embodied in a "free-standing" self-healing composite 45, FIG. 11, comprising the base coating 23 and the barrier coating 24, without the substrate. Just as the base coating 23 and the barrier coating 24 of composite 25, FIGS. 4–7 can be formed on flat or curved substrates, so can the composite 45 be fabricated in flat or curved configurations. The exemplary process parameters and layer thicknesses given here for the composite 25 apply to the free-standing composite 45, FIG. 11, except that in general the base coating may be thicker if required to supply the structural integrity supplied in composite 25 by the substrate 22. For example, one design for an oxide/organo-silicone base/polymer substrate composite 25, FIG. 8 comprises: air/$SiO_2$(118.2)/$TiO_2$(18.1)/$Al_2O_3$(50.8)/$TiO_2$(27.1)/$Al_2O_3$(43.8)/$TiO_2$(20.8)/$Al_2O_3$(85.0)/silicone (0.010), where the oxide layer thicknesses are given parenthetically in nanometers (nm) and the base coating thickness is in inches. A corresponding free-standing, barrier coating/base coating configuration 45, FIG. 11, uses the same design and thicknesses, except that the base coating thickness is 0.010 inch.

EXAMPLES

TABLE 1 depicts the presently preferred parameters, including power, chamber pressure, gas and associated flow rates, and conveyor rotating speed parameters for (a) forming a silicon oxide barrier coating on polymer components and (b) forming a barrier coating comprising alternating layers of silicon oxide and silicon nitride on polymer components. As alluded to above, to form the silicon oxide barrier coating, the silicon is sputter deposited using silicon target 37 and a gas reaction device 39 and/or 41 oxidizes the silicon. Rotating the drum or cage on which the substrates are mounted alternatingly passes the substrates through the deposition and oxidation regions. To deposit alternating layers of silicon oxide and silicon nitride, oxygen and nitrogen reaction devices 39 and 41 are "operated" in alternating fashion to form alternating silicon oxide and silicon nitride layers.

TABLE 1

Deposition Parameters, Metal Oxide Barrier Coat

| Parameter | (a) SiO$_2$ | (b) SiO$_2$ | Al$_2$O$_3$ | TiO$_2$ |
| --- | --- | --- | --- | --- |
| Power (kw) | 9 | 9 | 12 | 10.5 |
| Press (10$^{-3}$ torr) | 3 | 3 | 3 | 3 |
| Gas 1, Ar Flow Rate (sccm) | 475 | 475 | 475 | 450 |
| Gas 2, O$_2$ Flow Rate (sccm) | 142 | 142 | 220 | 225 |
| Ion Gun Current (amps) | 8 | 8 | 7.5 | 8 |
| Rotational Speed (in./min) | 180 ipm | 180 | 180 | 180 |

Example 1

An oxygen-protected composite of the type shown in FIG. 4 can be formed starting with a multilayer inorganic oxide coating over the sensitive substrate of material such as polyimide. Initially, a thin conformal continuous base layer of space-qualified organo-silicone material such as Dow Corning DC93-500 can be deposited on the substrate by roll coating or other suitable method known to those of skill in the art, then cured, forming a base coating of 0.001 in. thickness. A coating of silicon oxide 1000 Å thick is then formed on the base-coated substrate using the MetaMode process parameters listed in Table 1(a).

Example 2

In a second example, an ultraviolet-protected composite was formed starting from the UV-sensitive polymer used in Example 1. Initially, a thin conformal continuous base layer of the same space-qualified organo-silicone material Dow Corning DC 93-500 was deposited as a substrate by mandrel casting, then cured, forming a base layer of 0.010 in. thickness (see FIG. 8). A 1-micrometer thick coating of alternating layers of silicon oxide, aluminum oxide and titanium oxide was then formed on the base-coated substrate using the MetaMode process parameters listed in Table 1(b). Testing established that the barrier coating and the organo-silicone base coating prevented gross attack of one another and of the polymer substrate, and eliminated ultraviolet degradation of the organo-silicone base coat and the substrate.

Example 3

Figure 8:
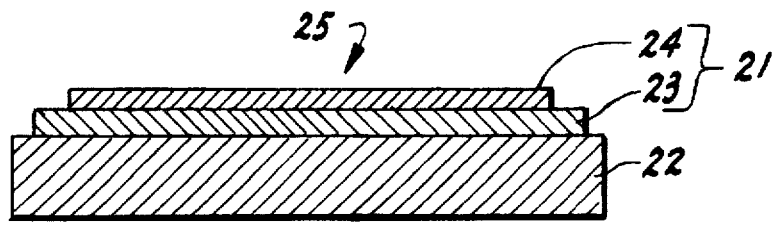
FIGS. 8 and 11 are enlarged schematic cross-sections of respectively, the preferred embodiment of our self-healing or self-repairing barrier structure and an alternative, "free-standing" embodiment of our invention, one in which the sacrificial coating is also the substrate.

The process of Example 1 can be modified to form the FIG. 8 configuration in which the base coating and the substrate are combined in a 0.001 in. thick flexible layer of the cured organo-silicone material used in Examples 1 and 2. A coating of silicon oxide 1000 Å thick was then formed on the basecoat/substrate using the MetaMode process parameters listed in Table 1(a).

Based upon the above disclosure of preferred and alternative embodiments of our invention, those of usual skill in the art will readily derive alternatives and implement modifications which are equivalent to our invention and within the scope of the claims of this patent document. For example, and as discussed above, our invention is not limited to mere ultraviolet-protecting barrier layers, but also applies to barrier coatings which have other optical functions as well.

What is claimed is:

1. A UV-protected and oxygen-protected composite, comprising:

a flexible polymer-containing substrate subject to deterioration by exposure to oxygen and ultraviolet radiation;

a metal oxide barrier coating having a thickness lying substantially within a range of 500 Angstroms to 10,000 Angstroms comprising silicon oxide formed on the substrate for protecting the substrate from degradation by ultraviolet radiation and oxygen; and an intermediate silicon-containing coating for forming oxides in the presence of oxygen to repair breaches in the barrier coating and thereby protect the barrier coating from degradation by oxygen, the thickness of said silicon-containing intermediate coating being substantially within the range of 0.001 inch to 0.01 inch.

2. The composite of claim 1, wherein the intermediate coating comprises organo-silicone.

3. The composite of claim 1, further comprising a coating of adhesion primer formed between the substrate and the silicon-containing coating for increasing the adhesion of the intermediate silicon-containing coating to the substrate.

4. The composite of claim 1, wherein the barrier coating comprises a plurality of layers of different materials.

5. The composite of claim 4, wherein the barrier coating is an optical filter comprising alternating layers of metal oxides.

6. The composite of claim 4, wherein the barrier coating is a stress-controlled optical coating comprising alternating layers of silicon oxide and aluminum oxide.

* * * * *